United States Patent
Chou et al.

(10) Patent No.: US 7,067,957 B2
(45) Date of Patent: Jun. 27, 2006

(54) CERAMIC TRANSFORMER LEVEL DRIVING CIRCUIT

(75) Inventors: Chin-Wen Chou, Taipei Hsien (TW); Eddie Cheng, Taipei Hsien (TW); Kuang-Ming Wu, Taipei Hsien (TW); Chih-Chang Lin, Taipei Hsien (TW)

(73) Assignee: Zippy Technology Corp., Taipei (TW)

( * ) Notice: Subject to any disclaimer, the term of this patent is extended or adjusted under 35 U.S.C. 154(b) by 154 days.

(21) Appl. No.: 10/745,592

(22) Filed: Dec. 29, 2003

(65) Prior Publication Data

US 2005/0146245 A1 Jul. 7, 2005

(51) Int. Cl.
*H01L 41/107* (2006.01)

(52) U.S. Cl. .................................................. 310/318

(58) Field of Classification Search .................. 310/318
See application file for complete search history.

(56) References Cited

U.S. PATENT DOCUMENTS 5,866,969 A * 2/1999 Shimada et al. ............. 310/318

* cited by examiner

*Primary Examiner*—Thomas M. Dougherty
(74) *Attorney, Agent, or Firm*—Birch, Stewart, Kolasch & Birch

(57) ABSTRACT

A ceramic transformer level driving circuit mainly aims to transform a low voltage signal to another low voltage signal through an amplified signal to drive a medium voltage system. It includes a control unit to generate a resonant frequency and output phase signal waveforms, a waveform transformation unit to provide phase signals and perform waveform phase transformation for the phase signal waveforms, and a medium voltage driving circuit which includes a floating level unit and a driving unit which receives a medium voltage electric input. The driving unit actuates opening and closing at different time to enable the floating level unit to output a voltage floating level thereby to drive a ceramic transformer to control the medium voltage system through a low voltage level.

5 Claims, 5 Drawing Sheets

CERAMIC TRANSFORMER LEVEL DRIVING CIRCUIT

FIELD OF THE INVENTION

The present invention relates to a ceramic transformer level driving circuit and particularly to a driving circuit that amplifies a small waveform transformed signal to drive a medium voltage system.

BACKGROUND OF THE INVENTION

At present the liquid crystal display (LCD) used in desktop and notebook computers, PDA and Webpad mostly employs a driving device to output high voltage, and through a ceramic transformer to ignite a cold cathode fluorescent lamp (CCFL). The technique adopted by the conventional driving devices is discussed as follows:

Referring to FIGS. 1A and 1B, an electric unit 14 delivers electricity to a control unit 10 and a driving unit 13. The control unit 10 outputs two positive phase signal waveforms 11 and 12 to control operations of the driving unit 13. The driving unit 13 is a push-pull amplifier consisting of a P-MOSFET 131 and a N-MOSFET 132. When the positive phase signal waveform 11 output from the control unit 10 reaches the P-MOSFET 131, the P-MOSFET 131 is located at the lower side of the positive phase signal waveform 11 and in a conductive state. Another positive phase signal waveform 12 reaches the N-MOSFET 132, the N-MOSFET 132 is located at the upper side of the positive phase signal waveform 12 and in a conductive state. Under the actuation of the P-MOSFET 131 and the N-MOSFET 132, the driving unit 13 outputs a medium voltage level to drive a driving inductor 15 and a ceramic transformer 16 to ignite a CCFL 17. The positive phase signal waveforms 11 and 12 have time difference, namely dead time 111 (as shown in FIG. 1B). The dead time 111 aims to prevent the P-MOSFET 131 and N-MOSFET 132 from being conductive at the same time and result in over short and burn out.

The P-MOSFET 131 has characteristics of electronic hole flow while the N-MOSFET 132 has characteristics of electron flow. The electron flow can generate energy three times as the electronic hole flow does. Hence using one N-MOSFET 132 is equivalent to using three P-MOSFET 131. Therefore employing a high power to drive the ceramic transformer 16 and CCFL 17, the cost of P-MOSFET 131 is much greater. As a result, the driving circuit also is expensive.

SUMMARY OF THE INVENTION

Therefore the primary object of the present invention is to provide a ceramic transformer level driving circuit that uses N-MOSFET to replace P-MOSFET.

The ceramic transformer level driving circuit according to the invention includes a control unit, a waveform transformation unit and a medium voltage driving circuit. The control unit outputs two phase signal waveforms through a resonant frequency and provides waveform phase transformation through the waveform transformation unit. The medium voltage driving circuit includes a floating level unit and a driving unit which receives a medium voltage electric input. The driving unit consists of two N-MOSFETs. The first N-MOSFET is controlled by the transformed first phase signal to open and close. The second N-MOSFET is controlled by the transformed second phase signal to open and close. The first and the second N-MOSFET perform opening and closing operations at different time to enable the floating level unit to output a voltage floating level. The driving unit performs opening and closing operations at different time to enable the floating level unit to output a voltage floating level to drive the ceramic transformer, thereby a lower voltage level may be used to control a medium voltage system.

DETAILED DESCRIPTION OF THE PREFERRED EMBODIMENTS

The foregoing, as well as additional objects, features and advantages of the invention will be more readily apparent from the following detailed description, which proceeds with reference to the accompanying drawings.

Figure 1A:
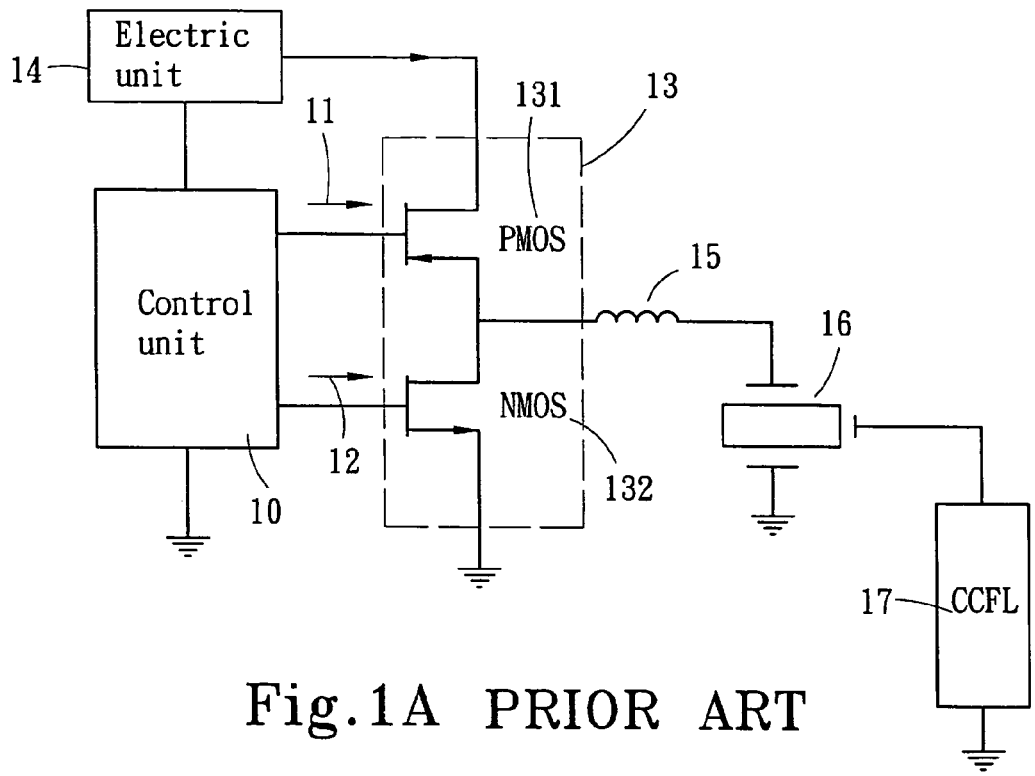
FIG. 1A is a block diagram of a conventional technique for driving a CCFL.
Figure 1B:
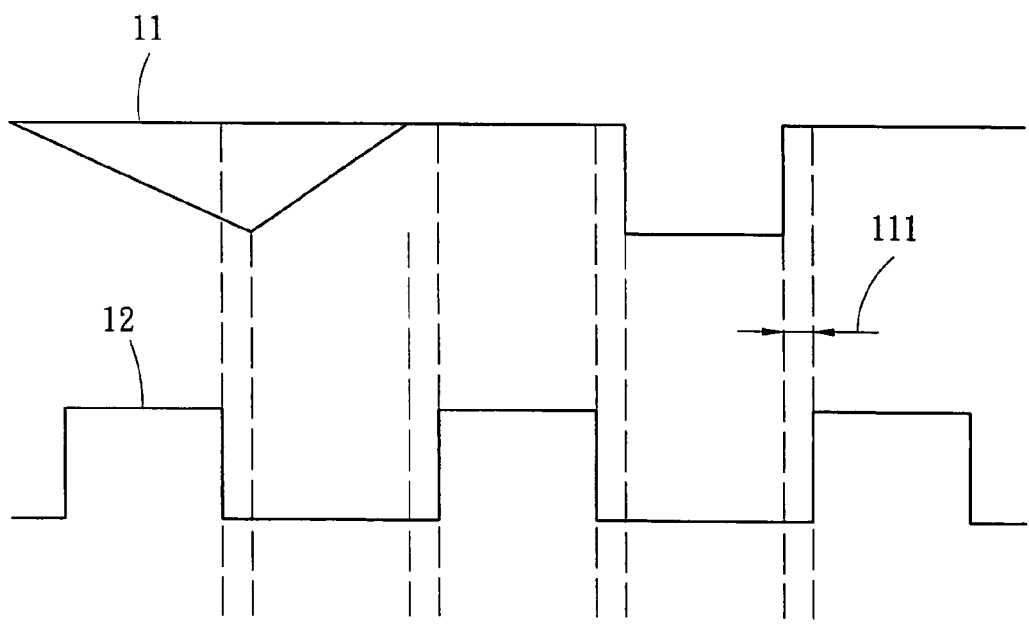
FIG. 1B is a schematic view of conventional driving waveforms.
Figure 2A:
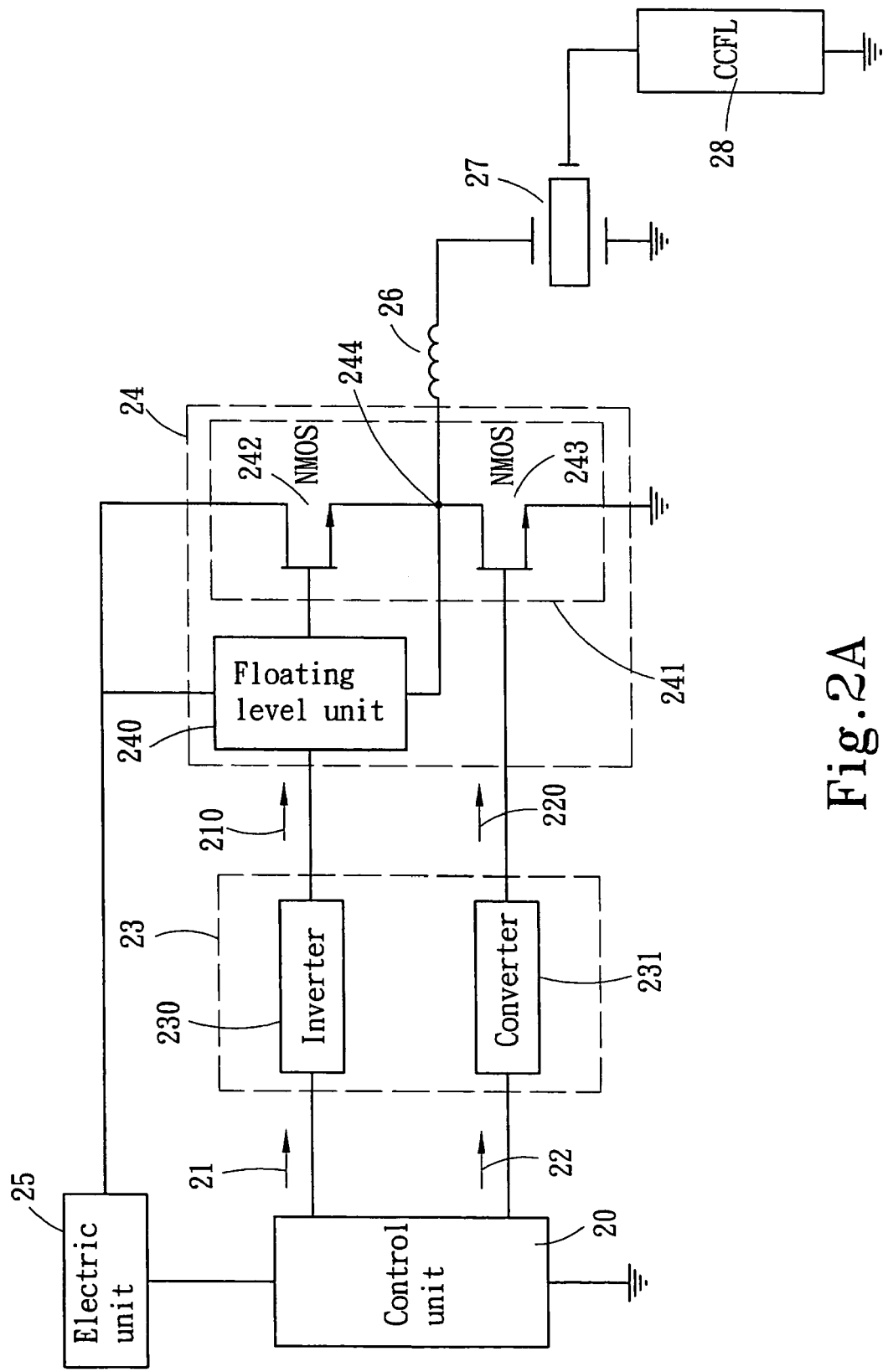
FIG. 2A is a block diagram of the present invention.
Figure 2B:
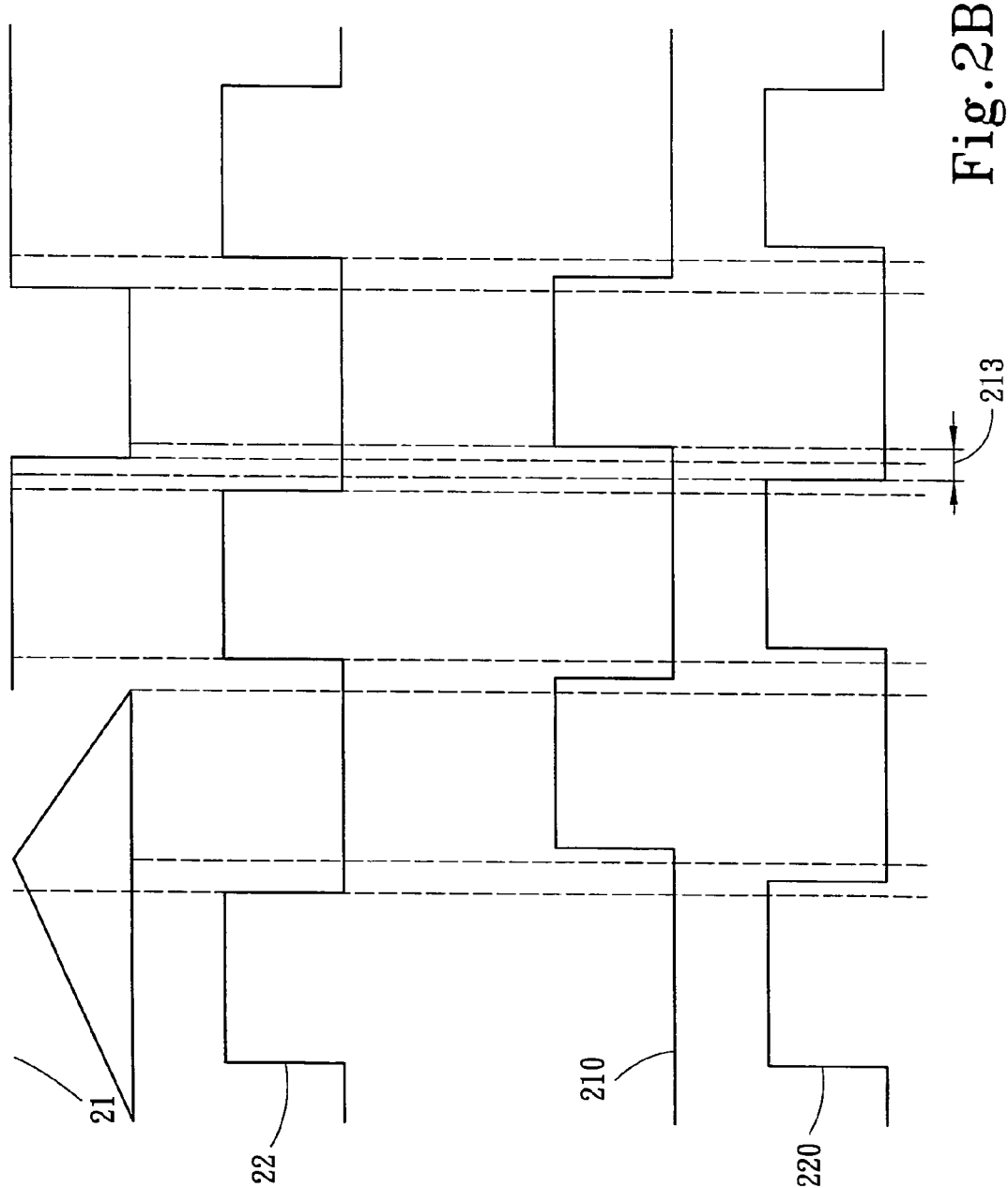
FIG. 2B is a schematic view of driving waveforms according to the present invention.

Please referring to FIGS. 2A and 2B, the ceramic transformer level driving circuit according to invention includes:

a control unit 20 to receive low voltage electricity from an electric unit 25 and generate a resonant frequency and output a first phase signal waveform 21 and a second phase signal waveform 22 (being two positive phase signal waveforms);

a waveform transformation unit 23 to provide an inverter 230 and a converter 231 for waveform phase transformation of the first phase signal waveform 21 and second phase signal waveform 22. The positive phase signal waveform 21 is transformed to a first phase signal 210 through the inverter 230 (as shown in FIG. 2B). Another positive phase signal waveform 22 is deferred to become a second phase signal 220 (as shown in FIG. 2B). The transformed first and second phase signals 210 and 220 lag behind the positive phase signal waveforms 21 and 22 slightly. Hence there is a time difference, i.e. a dead time 213, between the first phase signal 210 and the second phase signal 220 (referring to FIG. 2B); and a medium voltage driving circuit 24 which includes a floating level unit 240 and a driving unit 241 which receives a medium voltage electric input. The driving unit 241 consists of two N-MOSFET 242 and 243. The first N-MOSFET 242 is controlled by the transformed first phase signal 210 to open and close. The second N-MOSFET 243 is controlled by the transformed second phase signal 220 to open and close. The first N-MOSFET 242 and second N-MOSFET 243 open and close at different time to enable the floating level unit 240 to output a voltage floating level at an output end 244 thereof to drive an inductor 26 and a ceramic transformer 27 thereby to ignite a CCFL 28. The dead time 213 aims to prevent the first N-MOSFET 242 and the second N-MOSFET 243 to become conductive at the same time and result in instantaneous over short and cause burn out. Thus the dead time 213 can serve as a buffer to prevent the first N-MOSFET 242 and the second N-MOSFET 243 from operating at the same time.

Embodiment 1

Figure 3:
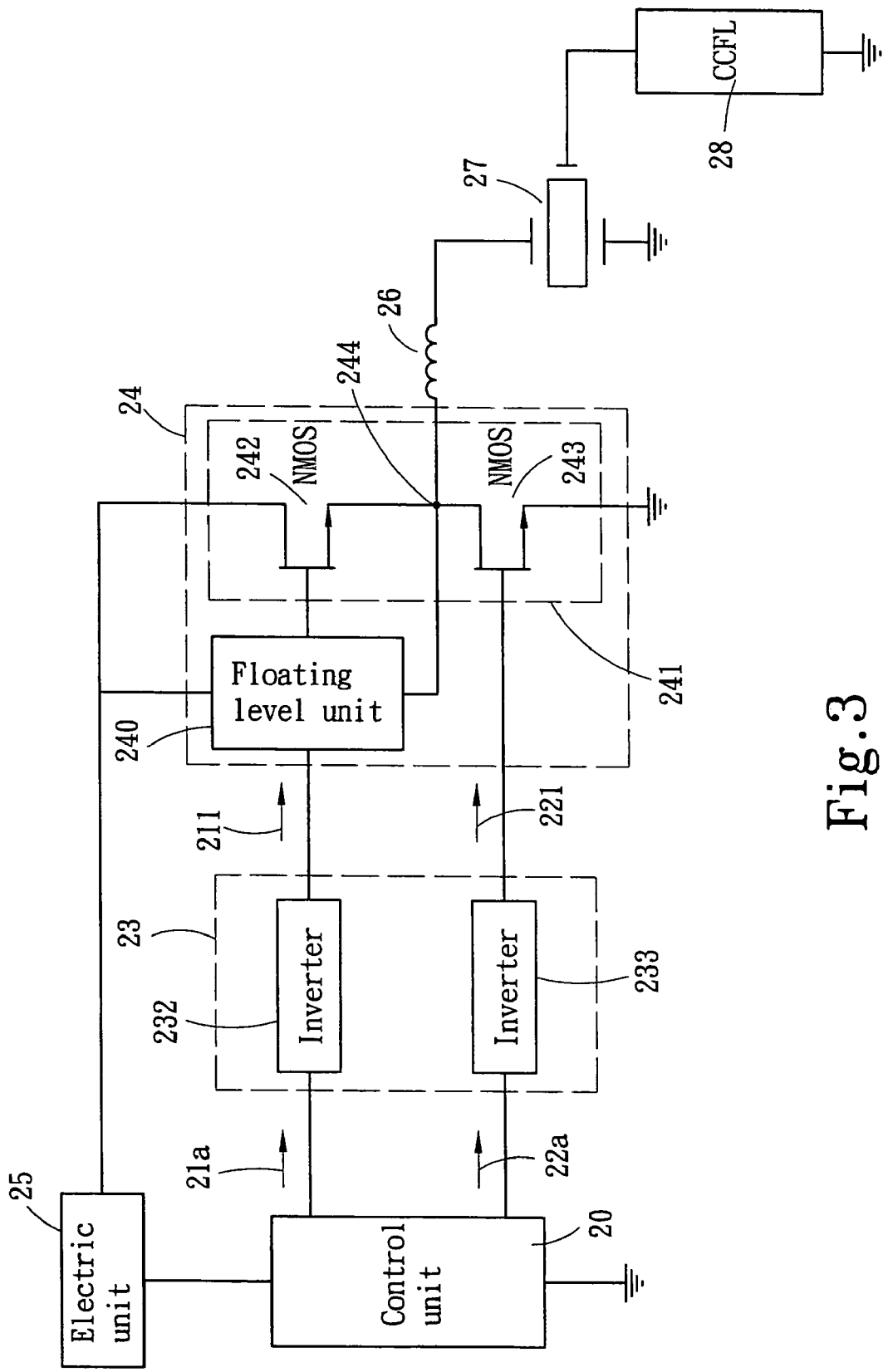
FIG. 3 is a block diagram of an embodiment of the present invention.

Refer to FIG. 3 for the first embodiment of the invention. The control unit 20 receives low voltage electricity from the electric unit 25 and generates a resonant frequency and outputs a positive phase signal waveform 21a and an inverse phase signal waveform 22a. The waveform transformation unit 23 includes two inverters 232 and 233 to perform transformation and deferring. While the positive phase signal waveform 21a is transformed to a first phase signal 211 through the first inverter 232, the inverse phase signal waveform 22a is transformed to a second phase signal 221 through another inverter 233 (the load driving process of the first and second phase signals 211 and 221 is same as previously discussed, thus details are omitted).

Second Embodiment

Figure 4:
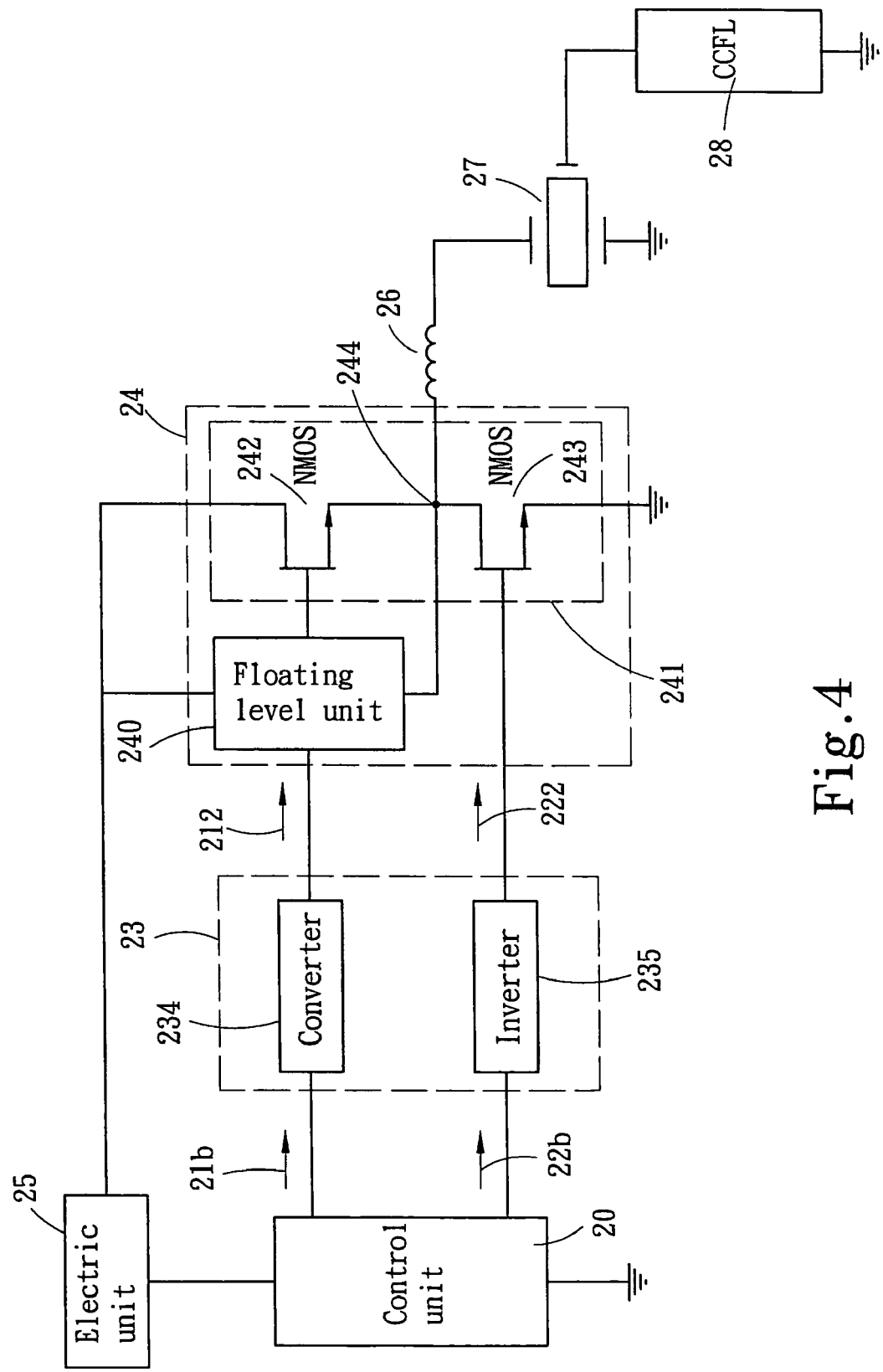
FIG. 4 is a block diagram of another embodiment of the present invention.

Refer to FIG. 4 for the second embodiment of the invention. The control unit 20 receives low voltage electricity from the electric unit 25 and generates a resonant frequency and outputs two inverse phase signal waveforms 21b and 22b. The waveform transformation unit 23 includes a converter 234 and an inverter 235 to perform transformation and deferring operations. While the inverse phase signal waveform 21b is transformed to a first phase signal 212 through the converter 234, another inverse phase signal waveform 22b is transformed to a second phase signal 222 through the inverter 235 (the load driving process of the first and second phase signals 212 and 222 is same as previously discussed, thus details are omitted).

While the preferred embodiments of the invention have been set forth for the purpose of disclosure, modifications of the disclosed embodiments of the invention as well as other embodiments thereof may occur to those skilled in the art. Accordingly, the appended claims are tended to cover all embodiments which do not depart from the spirit and scope of the invention.

What is claimed is:

1. A ceramic transformer level driving circuit, comprising:
    a control unit for receiving low voltage electricity and generating a resonant frequency and outputting a first phase signal waveform and a second phase signal waveform;
    a waveform transformation unit performing waveform phase transformation of said first phase signal waveform and said second phase signal waveform through a first phase converter and a second phase converter; and
    a medium voltage driving circuit including a floating level unit and a driving unit which receives medium voltage electric input, said driving unit consisting of two N-MOSFET, said first N-MOSFET being controlled by a transformed first phase signal for opening and closing, said second N-MOSFET being controlled by a transformed second phase signal for opening and closing, said first N-MOSFET and said second N-MOSFET being opened and closed at different time such that said floating level unit Outputs a voltage floating level.

2. The ceramic transformer level driving circuit according to claim 1, wherein said first phase signal waveform and said second phase signal waveform are positive phase signal waveforms, said first phase converter being an inverter and said second phase converter being a positive converter.

3. The ceramic transformer level driving circuit according to claim 1, wherein said first phase signal waveform is a positive phase signal waveform and said second phase signal waveform is an inverse phase signal waveform, said first phase converter and said second phase converter being inverters.

4. The ceramic transformer level driving circuit according to claim 1, wherein said first phase signal waveform and said second phase signal waveform are inverse phase signal waveforms, said first phase converter being an inverter and said second phase converter being a positive converter.

5. The ceramic transformer level driving circuit according to claim 1, wherein said first phase converter and said second phase converter perform waveform transformation simultaneously to form said first phase signal waveform and said second signal waveform that have time difference.

* * * * *